United States Patent [19]

Pogge

[11] 4,307,180
[45] Dec. 22, 1981

[54] PROCESS OF FORMING RECESSED DIELECTRIC REGIONS IN A MONOCRYSTALLINE SILICON SUBSTRATE

[75] Inventor: Hans B. Pogge, Hopewell Junction, N.Y.

[73] Assignee: International Business Machines Corp., Armonk, N.Y.

[21] Appl. No.: 180,535

[22] Filed: Aug. 22, 1980

[51] Int. Cl.³ .............................................. G03C 5/00
[52] U.S. Cl. .................................. 430/314; 430/317; 156/647; 156/649; 156/657; 156/662
[58] Field of Search ............... 430/314, 317; 156/643, 156/649, 657, 662, 647

[56] References Cited

U.S. PATENT DOCUMENTS

| | | | |
|---|---|---|---|
| 4,025,411 | 5/1977 | Hom-Ma et al. | 156/643 |
| 4,104,086 | 8/1978 | Bondur et al. | 156/643 |
| 4,104,090 | 8/1978 | Pogge | 156/657 |
| 4,222,792 | 9/1980 | Lever et al. | 156/643 |

OTHER PUBLICATIONS

IBM Technical Disclosure Bulletin, vol. 21, No. 5, Oct. 1978, p. 1849.
Schaible et al., IBM Technical Disclosure Bulletin, pp. 2893-2894, vol. 17, No. 10, Mar. 1975.

*Primary Examiner*—J. Travis Brown
*Attorney, Agent, or Firm*—Wolmar J. Stoffel

[57] ABSTRACT

A method of forming surface planarity to a substrate during removal of excess dielectric material when fabricating recessed regions of dielectric material in a semiconductor device wherein a dielectric layer is formed on the surface of the silicon substrate, a relatively thick layer of polycrystalline silicon deposited over the $SiO_2$ layer, openings formed through the polycrystalline layer and $SiO_2$ layer and into the substrate to form trenches, vapor depositing a layer of dielectric material over the surface of the substrate to a depth sufficient to fill the trench, depositing a planarized layer over a layer of dielectric material, reactive ion etching the planarizing layer, the dielectric layer, the polycrystalline layer, and selectively removing the remaining polycrystalline silicon layer to expose the $SiO_2$ layer.

9 Claims, 10 Drawing Figures

PROCESS OF FORMING RECESSED DIELECTRIC REGIONS IN A MONOCRYSTALLINE SILICON SUBSTRATE

DESCRIPTION

1. Technical Field

The present invention relates to an improved method for fabricating a semiconductor device provided with recessed regions of dielectric material for isolating individual elements of the device, more particularly to a method of forming deep dielectric isolation zones or regions wherein the improvement is restoring surface planarity to the substrate during the removal of excess dielectric material used to form the dielectric regions.

2. Background Art

In the monolithic integrated circuit technology, it is usually necessary to isolate various active and passive elements from one another in the integrated circuit structure. These devices have been isolated by back biasing, PN junctions, partial dielectric isolation and complete dielectric isolation. The dielectric materials used in dielectric isolation techniques have been silicon dioxide, glass, etc. The preferred isolation for these active devices and circuits is some form of dielectric isolation. Dielectric isolation in integrated circuit devices has a substantial advantage over the PN junction isolation because potentially it allows the abutting of the circuit elements against the isolation regions and thereby achieves greater density of packing of the active and passive devices on the integrated circuit device.

One form of dielectric isolation involves the formation of grooves or depressions in silicon where the isolation regions are to be formed. During the groove formation, the remainder of the silicon surface is protected by a protective film which is substantially unaffected by the silicon etch used to form the grooves and also to an oxidative environment. The usual protective layer is a silicon nitride, silicon dioxide, sandwich layer. Following the formation of the grooves by conventional chemical etching, the silicon body is subjected to a conventional oxidation step whereby the silicon in the groove area is oxidized and the silicon dioxide fills up the groove as well as oxidizing further into the silicon to form the isolation region. One of the major problems with this process is what is known as "bird's beak".

The "bird's beak" is a nonplanar silicon dioxide formation at the top periphery of the groove and is caused by the lateral oxidation underneath the silicon nitride layer. Since the oxidation of a specific thickness of silicon requires an almost equivalent amount of free space to expand into, and since the $Si_3N_4$ limits the unrestricted expansion, the result is an up-pushing of the silicon nitride at the edge of the groove. The final consequence of this is a general stress in the perimeter region of the groove as well as difficulties in subsequently achieving good butted diffusions against the vertical portion of the silicon dioxide. This non-butting capability defeats a major benefit of the original purpose of the silicon dioxide region. This process is described more fully by E. Kooi U.S. Pat. No. 3,970,486, Clevenger U.S. Pat. No. 3,534,234, Peltzer U.S. Pat. No. 3,648,125 and I. Magdo et al., patent application Ser. No. 150,609, filed June 7, 1971.

Another technique for forming dielectric isolation is described in the V. Y. Doo U.S. Pat. No. 3,386,865 and "A Composite Insulator-Junction Isolation" by R. E. Jones and V. Y. Doo, published in Electrochemical Technology, Vol. 5, No. 5-6, May-June 1967, pp. 308-310. This technique involves the formation of a silicon dioxide layer or similar type of layer on the substrate in the region where dielectric isolation is desired. An epitaxial layer is grown upon the substrate in all regions except where the silicon dioxide is located leaving openings over the silicon dioxide. The surface of the epitaxial layer and the sides of the resultant openings are partially thermally oxidized. The openings are then filled by vapor deposition of polycrystalline silicon, silicon dioxide, or similar materials. This technique has some disadvantages. Selective epitaxy, as required by this technique, is very sensitive to the area relationship between silicon dioxide and silicon regions. For example, two different size silicon regions would tend to fill in at a different rate so that at the end of a process the regions are filled in to a different extent. Also, in mesa-type depositions, crystallographic faceting tends to occur. This results in pyramid-like growth and tends to widen the isolation regions beyond the original lithography capabilities. The slanted silicon/silicon dioxide interface will again cause difficulties in achieving reliable butted diffusions against the silicon dioxide region.

The formation of grooves and the filling of such grooves have been described by other publications such as the G. L. Kuhn, U.S. Pat. Nos. 3,892,608 and 3,969,168. In these patents, chemical etching is used to form a V groove, a rounded bottom groove, or a rectangular evacuated space. There is little detail as to how the groove is formed but it is clear that the groove would be limited by the nature of the chemical etching step. The process does not necessarily yield a planar surface and it requires photolithography after the formation of the grooves. D. K. Roberson U.S. Pat. No. 3,956,033 describes a similar chemical etch followed by filling with polycrystalline silicon. Here again, the groove is limited by the chemical etching technique and it is unclear how the overgrowth of the polysilicon is removed. U.S. Pats. K. E. Bean et al. No. 3,725,160 and W. R. Morcom et al. No. 3,979,237 also show filling of grooves. In these patents, the effect of chemical etching is more clearly brought out where it is shown that monocrystalline silicon are preferentially etched chemically to provide grooves having symmetrical sidewalls sloped at precise angles depending upon the particular face crystal to which the silicon surface is aligned.

U.S. Pat. No. 4,104,086 and 4,016,007 both disclose processes for forming deep recessed oxide isolation regions in a silicon substrate wherein grooves are formed in the substrate using reactive ion etching, a layer of $SiO_2$ formed on the surface to fill the grooves, and the $SiO_2$ layer subsequently removed everywhere on the surface except where the material is disposed in the grooves. A shortcoming of this process is that the thickness of the $SiO_2$ layer is not always uniform, and the surface is not planar. Thickness variations in a deposited layer, particularly a relatively thick layer are common, and the top surface of a chemical vapor deposited layer that has been deposited over a non-planar surface is also not planar. Cusps are commonly formed over the grooves. When the top $SiO_2$ layer with a non-uniform thickness and a non-planar surface is removed by reactive ion etching, portions of the silicon substrate where the oxide layer is thinner might also be removed. If thin diffused regions are in the substrate, a substrate might be rendered useless. Further, the non-planarity of the top surface of the silicon oxide layer is propulgated down to the resultant semiconductor surface. Such unevenness of the surface of the semiconductor device which will be fabricated into an integrated circuit device, disrupts the fabrication of the masking and associated process steps necessary for forming the device, as well as causing difficulty in fabricating the various metallurgy stripes on the surface.

DISCLOSURE OF INVENTION

It is an object of this invention to provide an improved process for forming deep dielectric isolation regions in which the silicon substrate is protected during etch-back of the dielectric layer used to form isolation regions.

Another object of this invention is to provide for producing recessed dielectric regions that include the step of planarizing the resultant substrate.

In accordance with the present invention, we provide a method of forming a recessed dielectric region in a silicon substrate which includes the following sequence of process steps:

forming a first $SiO_2$ layer on the surface of a silicon substrate, forming a relatively thick layer of polycrystalline silicon over the first layer, forming a second $SiO_2$ layer over the polycrystalline silicon layer, forming groove-like openings through the polycrystalline silicon layer, the first layer, and into the silicon substrate to the desired depth that define grooves, vapor depositing a layer of dielectric material over the surface of the substrate to a depth sufficient to fill the grooves, depositing a planarizing layer over the layer of dielectric material, reactive ion etching the planarizing layer, the layer of dielectric material, and partially into the polycrystalline silicon layer, selectively removing the remaining polycrystalline silicon layer to expose the first layer as the surface layer of the device.

BRIEF DESCRIPTION OF THE DRAWINGS

The details of our invention will be described in connection with the accompanying drawings in which.

BEST MODE FOR CARRYING OUT THE INVENTION

Referring now particularly to FIGS. 1A-B through FIGS. 5A-B, the manufacturing steps for forming recessed oxide region in a semiconductor device are illustrated. The vertical dimensions in the figures are exaggerated to more clearly illustrate the problems of the art and applicant's solutions. In each Figure, A and B are cross-sectional views taken at different locations on a semiconductor wafer or on different wafers in a batch of wafers undergoing the same process steps. Different cross-sectional views are illustrated to show the effects of inherent process variations on the product and better explain applicants' invention for compensating for such variables. The sequence of FIGS. 1A through 5A show views where the accumulated variations results in a deposition of thicker film than the average thickness of the film. In contrast, FIGS. 1B through 5B show accumulated variations where the deposition of the films are thinner than the average thickness of the films. The structure illustrated in FIG. 1A and FIG. 1B includes a monocrystalline silicon substrate 10, which is shown as P- conductivity for illustration purposes, with an N+ layer 12 over substrate 10 and an N- conductivity layer 14 on layer 12. For the purposes of the invention, either all or some of the regions or layers 10, 12 and 14 could be of opposite conductivity from the conductivity types indicated. However, it is preferred to have the layer 12 be a high conductivity region where it will ultimately be the collector of a bi-polar transistor. This structure can be fabricated by various techniques. However, the preferred technique is to provide a P- monocrystalline silicon substrate and diffuse an N+ blanket diffusion into the substrate by using conventional diffusion or ion implantation of an N type impurity such as arsenic, antimony or phosphorous to produce the N+ region with a surface concentration of between $1 \times 10^{19}$ and $1 \times 10^{21}$ atoms per cc. The layer 14 is subsequently grown onto substrate 10 over layer 12 by means of epitaxial growth. This may be done by conventional techniques such as the use of $SiCl_4/H_2$ or $SiH_4/H_2$ mixtures at growth temperatures of about 1000° C. to 1200° C. The N+ layer may have a typical thickness of between 1 to 3 microns, whereas the epitaxial layer has a thickness of from 0.5 to 10 microns, the exact thickness depending upon the device to be built.

Alternately, the structure could be made by various combinations of thermal diffusions, ion implantations and/or epitaxial growth which would include the formation of a buried sub-collector region where the subsequent formation of bi-polar devices is desired.

Figure 1A:
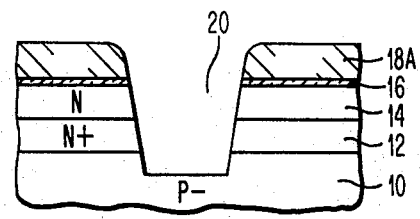
FIGS. 1A-B through FIGS. 5A-B depict a sequence of cross-sectional views which illustrate the process of the invention and the inherent thickness variations of depositing films.
Figure 1B:
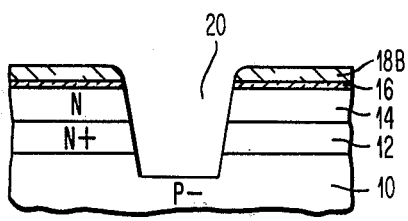

In certain device structures, buried, low resistivity regions or layers are not necessary and can therefore be omitted. This would be true of FET type devices. Multiple buried regions of different dopant types could be produced by a multiple epitaxial and diffusion process. These structures could be used for buried sub-collector, as well as buried subconductor lines. A silicon dioxide layer 16 is formed by conventional techniques of either thermal growth in a wet or dry oxygen ambient or by chemical vapor deposition. The thickness of layer 16 can be any suitable thickness typically between 250 to 10,000 Å, more preferably 1,000 to 3,000 Å. A layer of polysilicon 18 is deposited over $SiO_2$ layer 16 using conventional techniques. The polysilicon layer 18 can be deposited with the same apparatus used to form epitaxial layer 14, described previously or by any conventional deposition technique. The thickness of the polysilicon layer must be sufficient to compensate for any accumulation of deposition and etchant removal techniques used in the process which follows. The description of applicants' process which follows will provide a more clear understanding. In general the thickness of layer 18 will be in the range of 0.2 to 1.5 microns for typical device application. During the deposition of polysilicon layer 18 inherent thickness variations will occur over the surface of the same wafer and also between wafers in the same batch being processed. The variation is, in general, unavoidable and can be due to many factors including flow current within the reactor, the design of the reactor, variations in gas pressures, etc. In general, the variations in the final thickness will be about 10%. As indicated in FIGS. 1A and 1B, layer 18A is shown thicker than layer 18B in FIG. B to indicate such variations in layer thicknesses.

In order to form recessed oxide regions in a device, trenches or grooves 20 must be formed to a depth sufficient to reach through N+ region 12. These grooves 20 can be formed by any suitable technique, but are preferably formed by reactive ion etching. Techniques for forming grooves in a semiconductor by reactive ion etching techniques are described in Hochberg U.S. Pat. No. 3,966,577 and T. Kaji et al U.S. Pat. No. 3,997,378, and S. A. Abbas, IBM TDB Vol. 20, No. 1, P. 144 June 1977 entitled *Recessed Oxide Isolation Process*. A particularly advantageous process for etching silicon is described in J. M. Harvilchuck et al's patent application Ser. No. 594,413, filed July 9, 1975, now abandoned, for "Reactive Ion Etching of Silicon". In order to form grooves 20, a suitable mask is formed on the top surface of polysilicon layer 18A and 18B and the substrate exposed to reactive ion etching. A typical technique for forming a mask is to oxidize the surface of polysilicon layer 18A and 18B and remove portions thereof by conventional photolithographic techniques overlying the areas where trenches are desired. The masking layer is not illustrated since it is conventional in the art. Trenches 20 are then formed resulting in the cross-section shown in FIGS. 1A and 1B. The depth of the trenches must be sufficient to extend beneath N+ diffused region 12 in both FIG. 1A having a thicker layer 18A as well as FIG. B with a thinner layer 18B. In addition, there are inherent variations in the depth of the trench 20 using the surfaces of layer 18A and 18B as a reference.

Figure 2A:
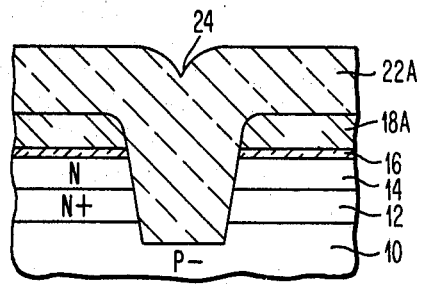
Figure 2B:
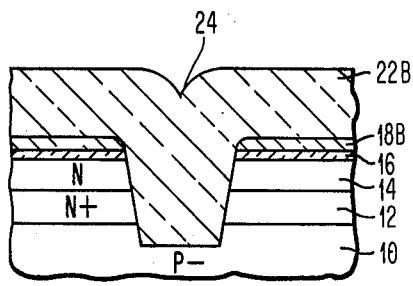

As illustrated in FIGS. 2A and 2B, the next step in the process of forming recessed oxide regions is filling the grooves 20 with a suitable dielectric material. In order to completely fill the groove 20, a blanket layer 22A and 22B of dielectric material must have a thickness at least one-half the width of the groove 20 or equal to the depth of the groove 20, whichever is appropriate. A preferred dielectric material for filling groove 20 is $SiO_2$ deposited by a chemical vapor deposition techniques using gas mixtures of $CO_2/SiH_4/N_2$ or $N_2O/SiH_4/N_2$ at 800°–1000° C. Typical deposition rates are of the order of 50 to 200 Å per minute and the total deposition thickness is at least one-half the width of groove 20. The width of groove 20 varies typically from 0.1 μm to 500 μm and the depth of groove 20 varies typically from 0.2 μm to 10 μm. The thickness of $SiO_2$ layer 22A and 22B also will inherently vary at different locations on the wafer, and from wafer to wafer by a figure of 10%. This, again, is illustrated in FIGS. 2A and 2B wherein the layer 22A is thicker than layer 22B in FIG. 2B. Another approach, not illustrated, in filling grooves 20 with dielectric material is to initially form a thin layer of thermal oxide on the sidewalls of the trench 20. A thermal oxide layer can conveniently be formed by subjecting the substrates to an oxidation ambient which may be, for example, 970° C. in wet oxygen. The substrate is subjected to the ambient for 10 to 30 minutes to produce a $SiO_2$ thickness within the trench 20 of about 500 to 2000 Å. The chemically vapor-deposited layer 22A and 22B can then be formed over the top surface of the thermal oxide layer in the groove.

Figure 3A:
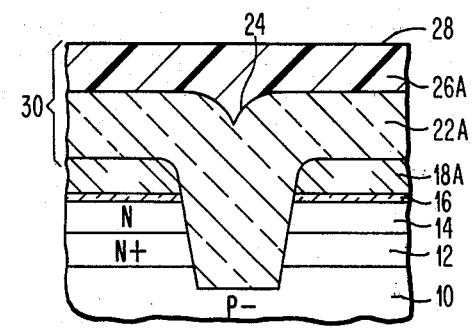
Figure 3B:
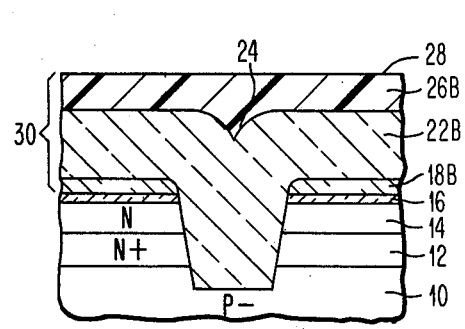

Depending on the depth and the width of groove 20, a depression or cusp 24 is formed on the surface over the filled channel 20. If a uniform surface thickness is removed from layer 22, the depression 24 will be propulgated downwardly and appear in the surface of the device. The depression can cause problems in fabricating the necessary metallurgy on the finished device. In order to eliminate the depression 24, a layer 26 of material is flowed over the surface to fill in the depression 24 to achieve a relatively planar surface 28. Layer 26 is preferably a layer of organic material such as polyimide resin, or a suitable resist material. The thickness can be any suitable thickness, preferably from 1 to 3.0 microns. As indicated in FIGS. 3A and 3B, variations in the thickness can result in the layer 26. In FIG. 3A the layer 26A is indicated as thicker than layer 26B in FIG. 3B.

Figure 4A:
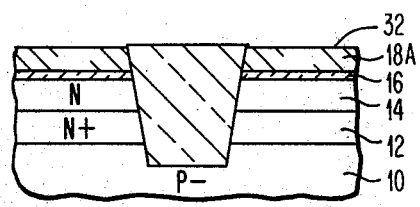
Figure 4B:
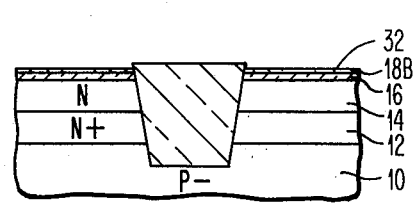
Figure 5A:
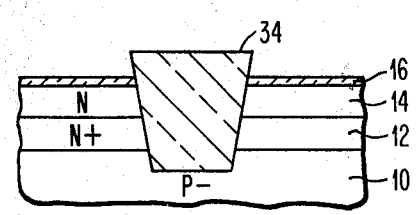
Figure 5B:
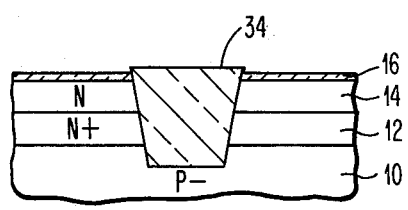

As indicated in FIG. 4A and FIG. 4B, layers 26, 22, and a portion of 18 are removed leaving the trench 22 filled with dielectric material which will serve as isolation regions encircling monocrystalline device regions to provide electrical isolation between associated elements on the same substrate. This removal step is accomplished by reactive ion etching of layer 26, layer 22 and a portion of layer 18. The system used for this process is preferably a low pressure sputter etch system with the substrate positioned on a silicon cathode cover plate. A fluorinated hydrocarbon such as $CF_4$ is used as an etchant so that the organic material/$SiO_2$/Si etch rate ratio of approximately 1 to 1 to 1 results. The gas pressure could run from 10 to 70 micrometers with gas flow rates of 2 to 50 cc/min. The RF polar level is preferably from 0.2 watts/cm$^2$ to 0.5 watts/cm$^2$. The reactive ion etching operation thus starts with a relatively smooth surface 28 and maintains this surface as the layers are progressively etched away, since the etch rates of Si, $SiO_2$ and polyimide are approximately the same. The objective of the removal process is to maintain a relatively planar surface while removing the materials above layer 16. Since the total thickness of the layers above layer 16 can vary due to inherent process variations, removal of the layers down to layer 16 at some locations where the layers were the thinnest would remove significant parts of layer 16 and region 14 which is unacceptable. In order to accommodate for this variation, polysilicon layer 18 is provided above layer 16. Therefore, in accordance with our invention, the reactive ion etchant operation is terminated when the top surface being etched occurs somewhere in layer 18. For example, suppose that thickness 30 is removed from the cross-section shown in FIGS. 3A and 3B. In FIG. 3A where the layer thicknesses were greater than the average layer thickness, the end point terminated well away from layer 16. However, in FIG. 3B where the layer thicknesses were below the average, but within the statistical variation, the end point of the etching operation occurs adjacent the top surface of layer 16. These end points are indicated in FIGS. 4A and 4B. The new surface after reactive ion etching is indicated in FIG. 4A and 4B. Note that the layer 18A is significantly thicker in FIG. 4A than is 18B in FIG. 4B. Thus the variations in uniformity of the deposited layers and the etching process appear in the variation in thickness in layer 18. The final step in forming the recessed regions by the method of our invention is removal of the remaining polysilicon material of layer 18 as shown in FIGS. 5A and 5B. In order to remove the polysilicon material, the substrate is exposed to an etchant that selectively etches only the polysilicon and not the silicon dioxide material. Such an etch is pyrocatechol. The pyrocatechol etchant will remove all of the polysilicon above the $SiO_2$ layer 16 in both the cross-sectional views shown in FIGS. 5A and 5B. Since the etchant rate of $SiO_2$ is very slow, the layer 16 serves as an etchant stop. Extreme care must be taken not to remove layer 16 or to allow the oxide refill to etch below layer 16 during the reactive ion etching process, otherwise the etchant for polysilicon layer 18 will attack the underlying silicon in region 14 and destroy the device. Alternately, the remaining polysilicon material can be removed by reactive ion etching in an ambient that selectively removes silicon. Examples are: $SF_6$ with a polysilicon to oxide etchant ratio of 15:1 or $SF_6/Cl_2$ with a polysilicon to oxide ratio of 45:1 or $Cl_2$/Argon with a polysilicon to oxide etchant ratio of 6:1. As indicated in FIG. 5A, there is a slight protrusion of recessed oxide region 34 above the surface of layer 16. However, the top surface of region 34 is planar without the depression 24 present in the deposited layer 22. The device shown in FIGS. 5A and 5B can then be further processed by forming diffusion openings in layer 16 and making the necessary diffusions to form the desired device structure. Subsequently, metallurgy can be deposited as is conventional in the art to form very dense integrated circuit devices.

While the invention has been particularly shown and described with reference to preferred embodiments thereof, it will be understood by those skilled in the art that various changes in form and detail may be made therein without departing from the spirit and scope of the invention.

What is claimed is:

1. A method of forming a recessed dielectric region in a silicon substrate comprising:
    forming an $SiO_2$ layer on the surface of said silicon substrate,
    forming a relatively thick layer of polycrystalline silicon over said $SiO_2$ layer.
    depositing a resist layer over said polycrystalline silicon layer,
    exposing and developing said resist layer to form openings that define the desired locations of desired said recessed dielectric regions,
    forming openings through said exposed polycrystalline silicon layer, said $SiO_2$ layer, and into said substrate to the desired depth that defines isolation trenches,
    chemical vapor depositing a layer of dielectric material over the surface of said substrate to a depth sufficient to fill said trenches,
    depositing a planarizing layer over said layer of dielectric material,
    reactive ion etching said planarizing layer, said layer of dielectric material, said second layer and partially into said polycrystalline silicon layer,
    selectively removing the remaining polycrystalline silicon layer with an agent that etches silicon at a significantly higher rate than $SiO_2$ to expose said $SiO_2$ layer as the surface layer.

2. The method of claim 1 wherein said layer of dielectric material is $SiO_2$.

3. The method of claim 2 wherein said remainder of the polycrystalline silicon layer is removed by pyrocatechol etchant.

4. The method of claim 2 wherein said remainder of the polycrystalline silicon layer is removed by reactive ion etching in an ambient that removes polycrystalline silicon at a significantly higher rate than $SiO_2$.

5. The method of claim 4 wherein said ambient used in reactive ion etching is $SF_6$.

6. The method of claim 4 wherein said ambient used in reactive ion etching is a combination of $SF_6$ and $Cl_2$.

7. The method of claim 1 wherein said reactive ion etching of said planarizing layer, said layer of dielectric material, and partially into said polycrystalline layer is achieved with an ambient selected from the group consisting of $X_2$, HX, $CX_4$, $CHX_3$, $CH_2X_2$, $CH_3X$, $C_2H_5X$, $C_2H_4X_2$, $C_2H_3X_3$, where X is a fluoride, chloride or bromide constituent.

8. The method of claim 1 or 2 wherein said planarizing layer is formed of a polyimide resin material.

9. The method of claim 2 wherein said planarizing layer is formed of a resist material.

* * * * *